Figure 1:
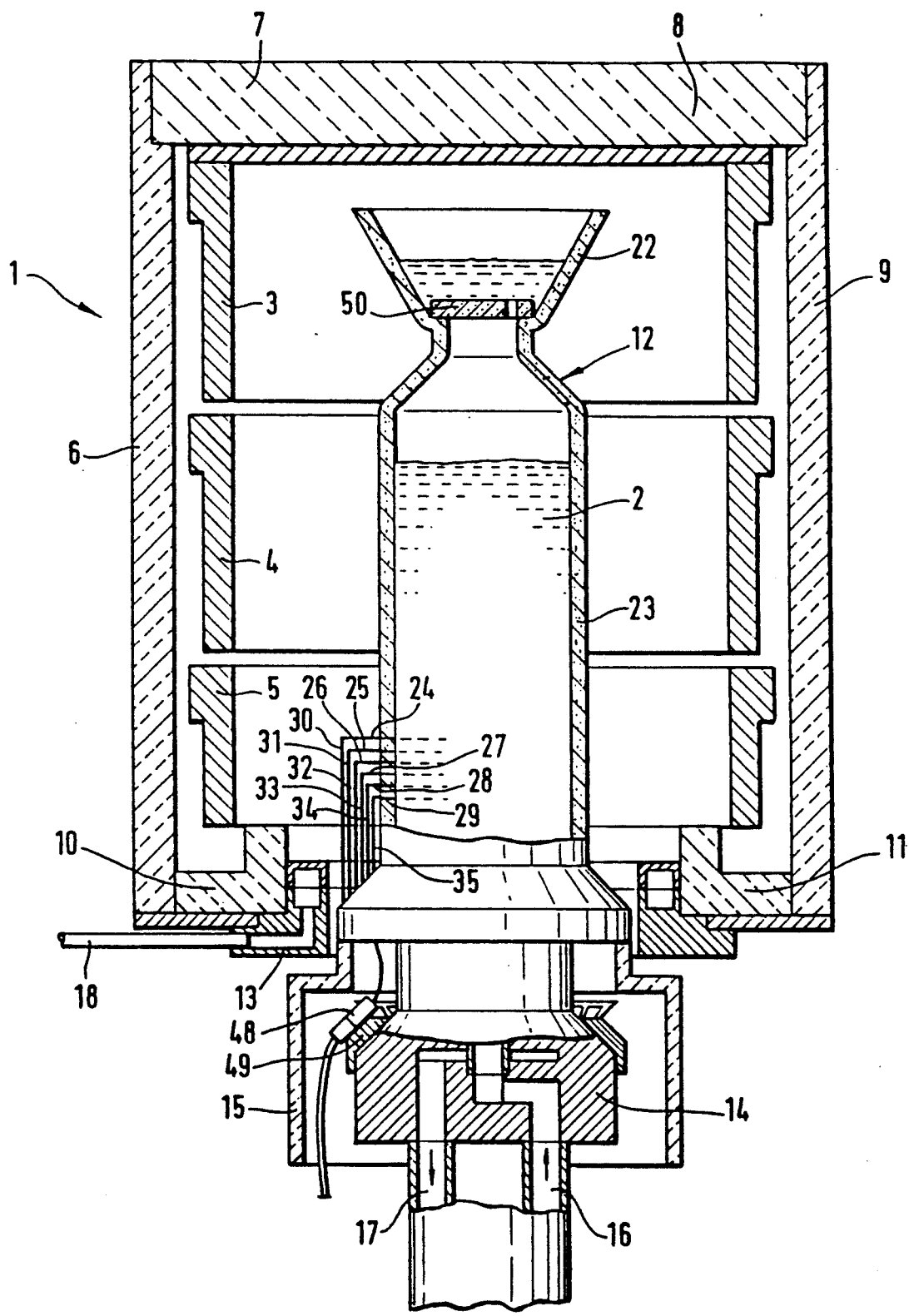

United States Patent [19]

Hugo et al.

[11] Patent Number: 5,197,531
[45] Date of Patent: Mar. 30, 1993

[54] METHOD OF MANUFACTURING DIRECTIONALLY SOLIDIFIED CASTINGS

[75] Inventors: Franz Hugo, Aschaffenburg; Harald Bittenbrünn, Hanau, both of Fed. Rep. of Germany

[73] Assignee: Leybold Altiengesellschaft, Hanau, Fed. Rep. of Germany

[21] Appl. No.: 869,906

[22] Filed: Apr. 15, 1992

Related U.S. Application Data

[63] Continuation of Ser. No. 561,198, Aug. 1, 1990, abandoned.

[30] Foreign Application Priority Data

Jun. 13, 1990 [DE] Fed. Rep. of Germany ....... 4018924

[51] Int. Cl.$^5$ ..................... B22D 25/00; B22D 46/00
[52] U.S. Cl. ................... 164/122.1; 164/4.1; 164/154
[58] Field of Search ........... 164/122.1, 122.2, 4.1, 164/150, 154

[56] References Cited

U.S. PATENT DOCUMENTS

| | | | |
|---|---|---|---|
| 3,897,815 | 8/1975 | Smashey | 164/122.1 |
| 3,931,847 | 1/1976 | Terkelsen | 164/122.1 |
| 4,307,769 | 12/1981 | Hauser et al. | 164/122.1 |
| 4,522,247 | 6/1985 | Lingarean et al. | 164/150 |
| 4,995,733 | 2/1991 | Thomas et al. | 164/150 |

Primary Examiner—Kuang Y. Lin
Attorney, Agent, or Firm—Felfe & Lynch

[57] ABSTRACT

The invention relates to a method of manufacturing directionally solidified and/or monocrystalline castings including at least one sensor for sensing temperatures in metal or allow melts contained in a mold, including a thermoelement 41 equipped with a heat resistant coating, this thermoelement being introduced into the melt. Subsequently, the position of the interface between liquidus and solidus is determined from the measured temperatures by means of interpolation, and the withdrawal speed of the casting is controlled such that during the withdrawal of the casting, the interface is always located in a desired area of the insulation 10 which slightly above the cooling head 14. For this purpose, it is advantageous that the temperature of the heating for heating up the mold be stored as a parameter in a computer over the distance covered by the mold and/or the respective position of the mold in the vacuum furnace. This heating temperature profile as a function of the respective position of the mold in the vacuum furnace in connection with the withdrawal speed of the mold is then available for further casting cycles in connection with the withdrawal speed profile as a reproducible value for subsequent casting cycles.

5 Claims, 4 Drawing Sheets

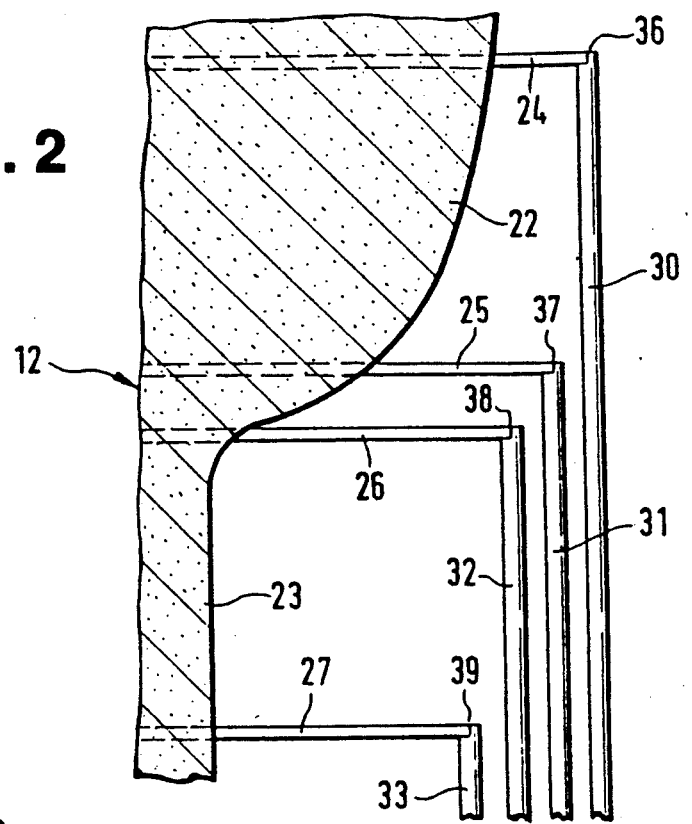
FIG. 2
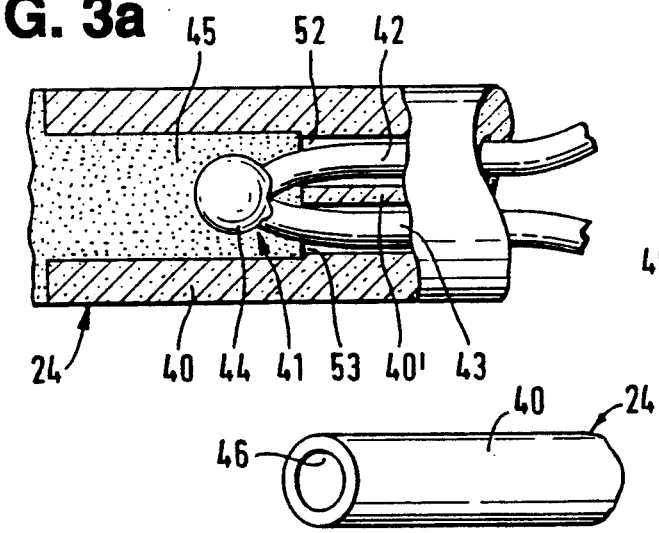
FIG. 3a
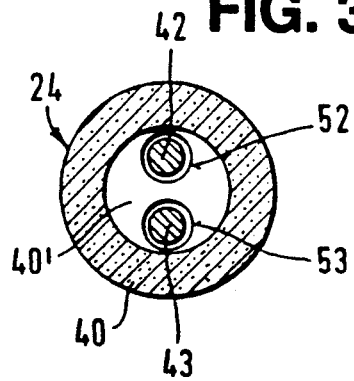
FIG. 3b
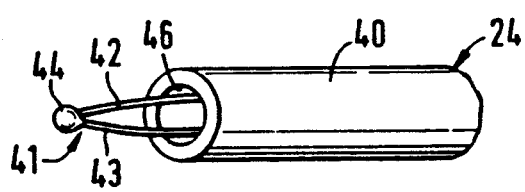
FIG. 4a
FIG. 4b
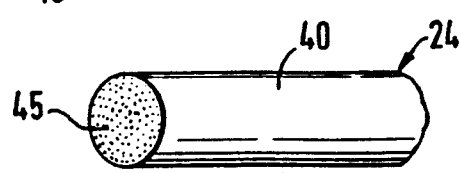
FIG. 4c

METHOD OF MANUFACTURING DIRECTIONALLY SOLIDIFIED CASTINGS

This application is a continuation of application Ser. No. 561,198, filed on Aug. 1, 1990, now abandoned.

The invention relates to a method of producing directionally solidified and/or monocrystalline castings including at least one sensor for sensing the temperatures in metal or alloy melts contained in a mold and, further, including a thermoelement provided with a heat-resistant coating. The thermoelement is hereby introduced into the melt.

Sensors are known for sensing temperatures in metal or alloy melts contained in a mold. The thermoelement has two elements and a welding bead at the connection point. Further, the thermoelement is provided with a heat resistant coating. The welding bead of the thermoelement is in the immediate vicinity of a first end of the coating which is closed with a $SiO_2$-free filling agent. This first end of the coating is directly introduced into the melt while a second end of the coating is connected to a support device. The purpose hereof is to reduce sensing errors at the solid-liquid interface. Since the tip of the sensors is directly immersed into the melt and included in the mold, the sensitivity of the measurement is increased.

The individual parameters are determined by means of other methods. According to one such method, the casting sample is cut open after it has been withdrawn in order to find out whether pouring off or withdrawing the casting from the heating zone with the correct withdrawal parameters resulted in the desired solidification. These empirically determined withdrawal parameters are then used to produce further castings. Obtaining reliable parameters in such a way requires long periods of development lasting up to six months and more.

This is where the invention seeks to provide an improvement. As characterized in the claims, the invention accomplishes this object in that a. the level of the liquid/solid interface is determined from the measured temperatures by means of interpolation, b. The withdrawal speed of the casting is controlled such that during the withdrawal, the liquid/solid interface is constantly in the desired area of insulation which is slightly above the cooling head. In this respect, it is advantageous to store the withdrawal speed profile over time (V=ft) in the memory of a computer. This speed profile and its parameters are then made available to further casting cycles which have the same or approximately the same geometry (together with the function of the desired value for the heating temperature) as a desired value for reproducible, temperature-controlled and/or speed-controlled withdrawal.

According to a particular feature, provision is finally made in the invention that the apparatus for the manufacture of directionally solidified and/or monocrystalline castings includes at least one sensor for sensing temperatures in metal or alloy melts, a data acquisition unit, a process computer, a control unit for controlling the withdrawal of the mold, a heating zone and a data storing device to store all data, particularly the withdrawal speed profile over time (V=ft) and/or the function of the distance covered by the mold. For this purpose, it is particularly advantageous when the temperature for heating the mold is stored in the computer as a parameter over the distance covered.

This heating temperature profile as a function of the respective position of the mold in the vacuum furnace in connection with the withdrawal speed of the mold is then available for further casting cycles in connection with the withdrawal speed profile as a reproducible value for subsequent casting cycles.

With the method in accordance with the invention for producing directionally solidified and/or monocrystalline castings, for example turbine blades, it is possible to first insert the thermoelements in the melt. Then, the liquid/solid interface is determined by means of the determined parameters and by interpolation. It is thus possible to control the withdrawal speed such that the liquid/solid interface is constantly in the desired range or in the optimal range, i.e. slightly above the cooling head. The withdrawal speed profile is then stored and with its parameters, it is available for like casting processes, i.e. the withdrawal speed profile is taken into consideration, and the next casting cycle can be repeated any number of times without using the thermoelements. Complicated, time-consuming computations and/or long series of experiments are not required. The withdrawal speed profile can advantageously be configured as a cam disk to control the withdrawal speed of the mold.

Moreover, the apparatus for the production of directionally solidified and/or monocrystalline castings advantageously includes at least one heating temperature control to control the heating in dependency upon the respective position of the mold in the vacuum furnace. The temperature profile can thus be easily established in dependency upon the respective position of the mold in the vacuum furnace. It is then used as a constant value for a casting cycles.

Additional features of the invention are shown in the description of the Figs. Note that all individual features and all combinations thereof are essential to the invention.

The Figs. show an example of an embodiment without, however, limiting the invention thereto. Referring now to the Figs.

Figure 5:
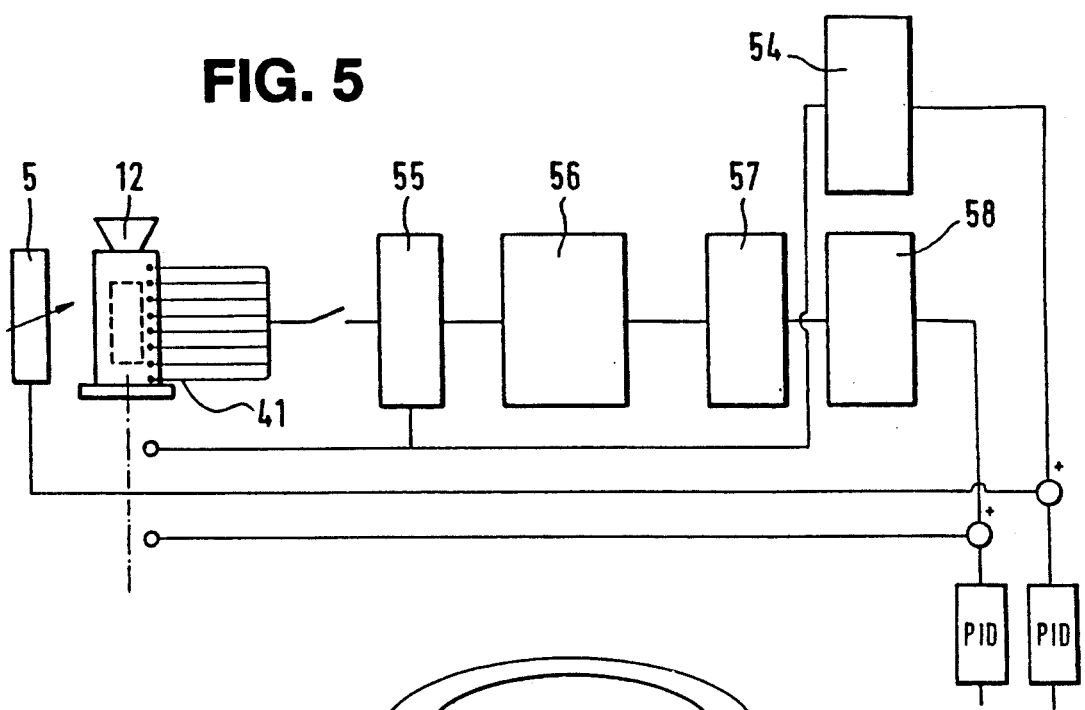
Figure 7:
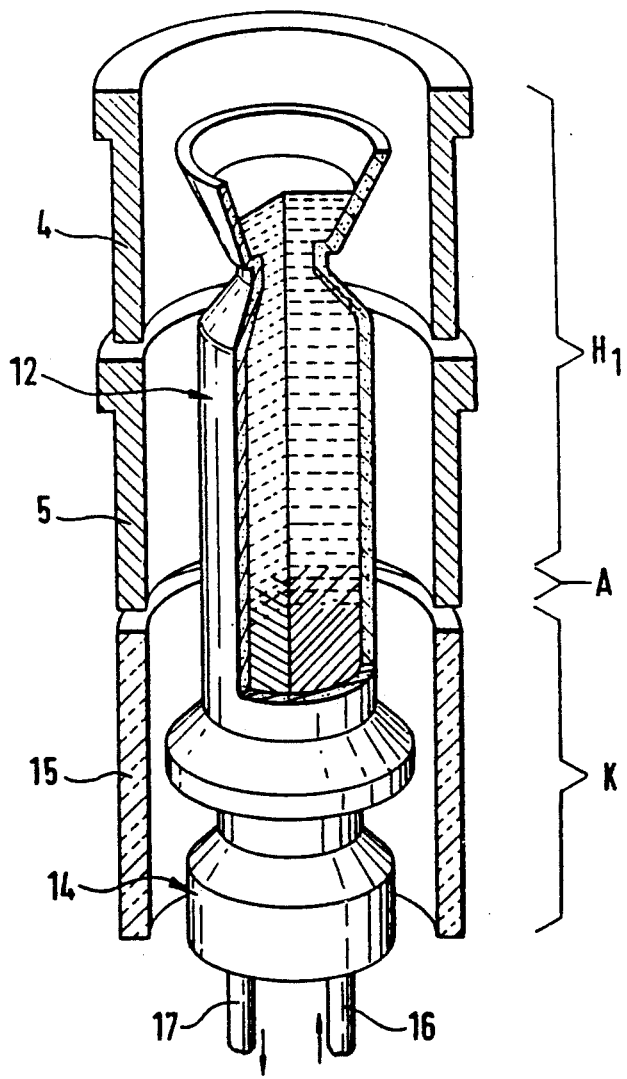
Figure 6:
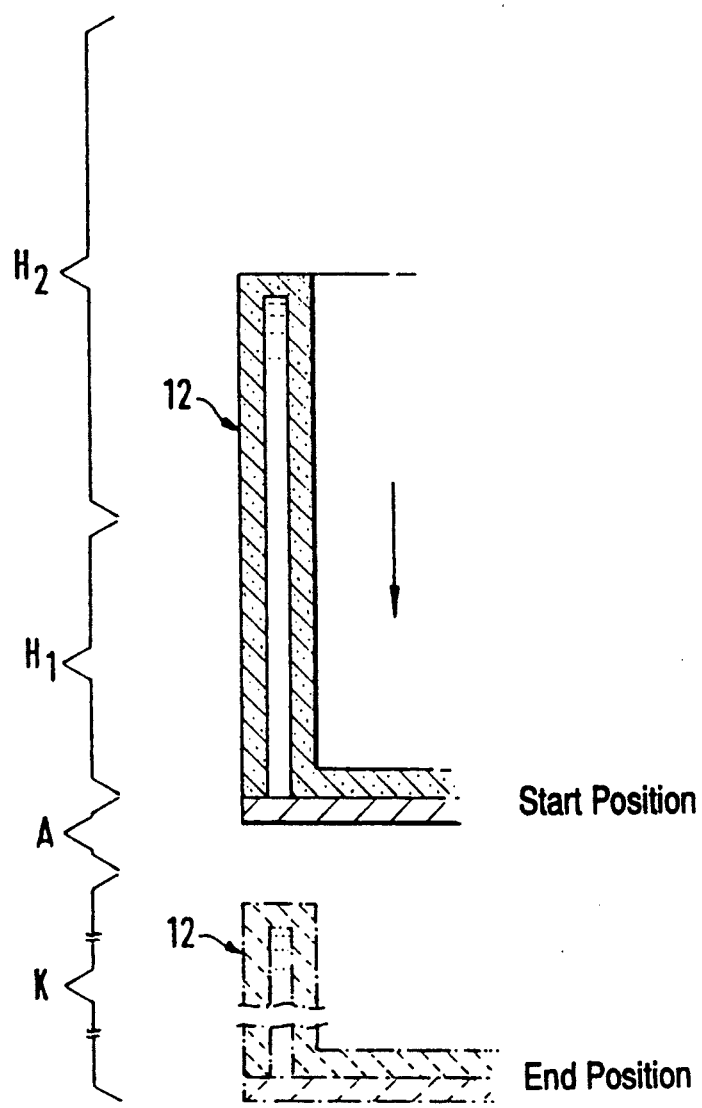
Figure 8:
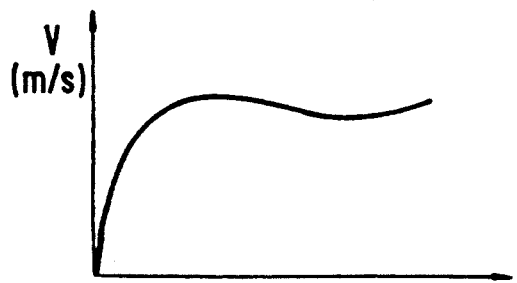
Figure 9:
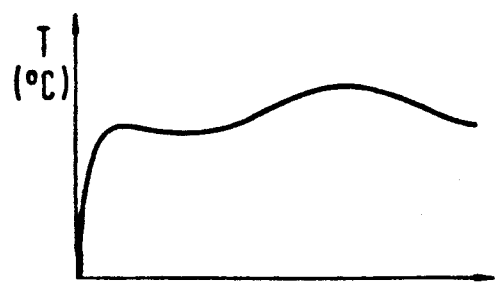

FIG. 1 is a vacuum furnace with a graphite heating,

FIG. 2 shows support capillaries and measuring capillaries positioned after the mold cup, FIG. 3 is a thermoelement enveloped by a ceramic tube, Figs. 3a to 4c show a thermoelement enveloped with a ceramic tube, and the introduction of the thermoelement in a ceramic tube, FIG. 5 is the process control unit FIG. 6 is a diagrammatic representation of the geometric proportions of the casting furnace including the heating zone $H_2$, $H_1$ with the adiabatic zone A and the cooling zone K in which a cooled copper plate is disposed, FIG. 7 is both a diagrammatic cross section and a perspective representation of the mold including a partial section of the solidus and liquidus zones, FIGS. 8 and 9 show the position of the mold over the distance covered in the heating furnace.

FIG. 1 is a sectional side view of a vacuum furnace 1 for the directional solidification of a melt 2. This vacuum furnace 1 has three cylinder-jacket-like graphite heating elements 3, 4, 5 which are protected from heat loss by an insulation 6–11. The insulation requires gaps between the heating elements 3, 4, 5. The electrical connections of the heating elements 3, 4, 5 are not represented in FIG. 1. Therefore, the heating elements are required to maintain the melt in a liquid state and to use a best-possible unidirectional heat flow to produce a directional solidification of the melt. In order to generate the temperature gradient necessary for the solidification of the melt 2, a guiding wall 13 is provided next to and underneath the insulating area 10. A cooling head 14 surrounded by a thermal shield 15 can vertically freely move in this guiding wall. The cooling head 14 has a feeding and a discharge pipe 16 and 17 for the conduct of water as a cooling agent. Another cooling pipe 18 for the supply of water is provided within the guiding wall 13 and below the insulating area 10. The corresponding cooling pipe for the discharge of water cannot be seen in FIG. 1 since it is covered by cooling pipe 18. The cooling via cooling pipe 18 is required to maintain a temperature gradient while heat is radiated from the molding cup 12 when the latter is lowered since the cooling head 14, in this case, does no longer affect the melt 2.

The melt 2 is poured in the mold and/or the molding cup 12 either directly or by means of a funnel which is not represented in the drawing. The funnel is provided with a relatively long pipe with a small opening and the mold or molding cup includes an upper funnel-like feature 22 and a lower pipe 23 which is disposed above the cooling head 14. It is also possible to omit the funnel and to pour material directly into the mold. A ceramic filter, which is covered with melt 2 after the latter has been filled in, is disposed between the funnel-like feature 22 and the pipe. Instead of a pipe 23, it is also possible to provide a mold of any other desired geometry, for example, the one of a turbine blade. The mold of the molding cup 12 preferably consists of a ceramic mass which is destroyed after completion of the casting process.

The thermoelement wires essential to the present invention are inside of measuring capillaries 24–29 and support capillaries 30–35 where they are protected from the aggressive furnace atmosphere. These numerous thermoelements serve to sense the temperature of the liquid/solid interface in the melt 2. The thermovoltages are tapped by means of compensating lines. A thermal shield 15 protects the latter from thermal radiation of the heating elements 3, 4, 5, and via plastic plug connection 48, they are connected to a strain relief 49. FIG. 1 shows only one plastic plug connection 48. In practice, however, each thermoelement has its own plug connection and its own compensating line leading to a non-represented evaluating device. FIG. 1 shows only a few of the measuring and supporting capillaries. In practice, it is possible to provide much more such capillaries.

FIG. 2 is an enlarged view of the measuring capillaries 24–27 and the supporting capillaries 30–11 which include the thermoelement bars. The upper part of the molding cup 12 is also visible. Whereas FIG. 1 shows the approach of the thermoelements toward the lower part 23 of the forming cup 12, FIG. 2 shows how the thermoelements approach the upper part 22 of this forming cup 12. Numerals 36 to 39 designate kinks in the thermoelement wires. These locations 36–39 are provided with fireproof cement hermetically sealing the bars of the thermoelement. In order to additionally support the measuring capillaries 24–27, a 90° angle is included in the top ends of the supporting capillaries 30–33 by grinding.

FIG. 3a is a partial section across a measuring capillary made of ceramics, for example. This ceramic capillary 24 contains a thermoelement 41 which includes two thermobars 42, 43 and a soldering or welding spot 44. The front part of the thermobars 42, 43 and the welding spot are immersed in a glue 45. The measuring capillaries 24 are no longer jacketed which is a significant advantage of the invention.

FIG. 3b is a view of the ceramic capillaries 24 with the two thermobars 42, 43. In a practical embodiment of the measuring capillaries 24, a thermobar has an external diameter of 0.1 mm, for example, whereas the capillary 24 has an external diameter of 0.9 mm and is provided with two boreholes 52, 53, each having an internal diameter of 0.2 mm. The diameter of the pocket borehole is 0.5 mm and the depth thereof is 0.1 mm. The thermobars 42, 43 are electrically insulated by means of the insulating body 40'. In the supporting capillaries, the thermobars 42, 43 are correspondingly electrically separated from one another.

FIGS. 4a to 4c illustrate the method according to which the thermoelement 41 is inserted into the ceramic capillaries 24.

FIG. 4a shows a part of the ceramic capillary 24 which has a front opening 46 and rear opening which is not visible in FIG. 4a. Since the ceramic capillary 24 has two boreholes 52, 53, it is also referred to as double borehole ceramic pipe. In the front opening 46, the insulating body is already included by drilling to a certain depth, i.e. provision is made for a pocket borehole.

FIG. 4b illustrates how the thermoelement 41 is inserted into the ceramic capillary 24. The capillary 24 in which the two thermobars 42, 43 were inserted was already spot-drilled at the tip thus providing it with a pocket borehole which can hold the welding bead 44 of the two bars 42, 43. The capillary 24 can be provided with a borehole in different ways including, for example, drilling by diamond drill, ultrasonic drilling or laser beam drilling.

FIG. 4c illustrates how the end of the ceramic pipe 40 is filled with glue and sealed after the thermoelement 41 has been pulled into this ceramic pipe 40. It is also possible to close the pipe 40 by means of welding, for example, using a hydrogen or acetylene burner, arcing or a laser beam. The thermoelement is thus insulated from its environment to such an extent that it has a high resistance time against aggressive melting. When glue is used, welding can be omitted thus also avoiding thermal stress acting on the capillary tip and the thermo wire with the welding bead 44. The advantage of welding is that the capillary can be sealed with material of the same kind.

The function of the device in accordance with the invention is described as follows.

The metal or alloy molten in a furnace, for example an electrofurnace, can be placed into a funnel by means of a non-represented device from where it slowly drops across the pipe into the molding cup 12. Since the cooling head 14 is at the bottom of the molding cup 12, a great temperature difference is generated between the molding cup 12 and the cooling head 14. The effect thereof is such that the molten metal solidifies from the bottom toward the top.

The invention enables the user to determine the course of the liquid/solid interface and thus allows to draw conclusions concerning the solidification conditions during the process. Also, conclusions are possible regarding the properties of the cast component.

During the directional solidification which runs from the bottom to the top, the ceramic capillary 24 and the thermoelement 41 are fixed in the melt 2 and can hence no longer be removed from the metal and/or the alloy.

When several sensors are used for measuring, all measuring capillaries 24–29, supporting capillaries 30–35, thermo wires 42, 43 and plugs 48 are ready made. A ceramic glue is then used to mount the tips of the measuring capillaries 24–29 in the prepared boreholes in the molding cup 12.

Since the sensors are very small, it is easily possible to determine the growth of the crystals. The sensors are directly introduced into the melt without interfering with the growth of the crystals. For the determination of the temperature gradient, it is important that sensor be small in dimension.

It is particularly advantageous when the interface is plane, i.e at a spot where there is no radial heat flow. This spot is therefore at a place above the water-cooled cooling head 14 in the insulating area 10. If, for example, the mold is moved down too fast, the solid/liquid interface moves out toward the bottom. If, on the other hand, the mold moves down too slow, the interface moves up into the furnace area $H_1$ such that it is no longer plane. It is therefore advantageous when the interface is always located slightly above the cooling ring 14, hence in the insulating area so as to maintain the interface surface plane or horizontal, that is.

In the method in accordance with the invention for the manufacture for the manufacture of directionally solidified and/or monocrystalline castings, for example turbine blades, the thermoelements 41 are first introduced into the melt (FIG. 1, 5). The solid/liquid interface is determined by means on interpolation. Subsequently, the withdrawal speed is controlled such that the interface is constantly located in a desired area, i.e. slightly above the cooling head 14. The withdrawal speed profile is then stored and with its parameters, it is then available for like casting processes. By making use of the withdrawal speed profile, it is possible to repeat the next casting cycle any desired number of times without the use of thermoelement. Complicated, time-consuming computation processes and/or series of experiments are no longer required.

It is particularly advantageous that the device for the working of a method for the manufacture of directionally solidified and/or monocrystalline castings has at least one or several sensors and/or measuring capillaries 24 to 30 for the sensing of temperatures in metal or alloy melts. Further, it comprises a data acquisition unit 55, a process computer 56, a control unit 57 for controlling the withdrawal of the mold from the heating zone 1 and/or 2. Moreover, it also includes a data storing device 58 for storing all data, particularly the withdrawal speed profile over time (V=ft) and for acquiring data on the heating temperature as a function of the distance covered by the mold when the latter leaves the heating zone.

Moreover, the device for the manufacture of directionally solidified and/or monocrystalline castings is provided with at least one heating temperature control 54 for the control of the heating temperature in dependency upon the respective position of the mold in the vacuum furnace 1 (FIG. 5, 8, 9). When the first mold is prepared, the desired values and/or determined heating temperatures are stored in the process computer with regard to the respective position of the mold in the furnace. This temperature profile is provided as a parameter with respect to the position of the mold. This parameter in turn results from the profile of the mold, e.g. a turbine blade. The withdrawal speed of the mold from the vacuum furnace 1 is determined during the preparation of the first melt. It is ensured that the solid/liquid interface is always located at a certain position. This speed curve, i.e. the withdrawal speed is also stored in a computer (FIG. 8). The so determined parameters are then available for subsequent casting processes.

We claim:

1. Method of manufacturing at least one of the group consisting of directionally solidified and monocrystalline castings in a vacuum furnace having a stationary insulating member comprising:

utilizing a plurality of sensors at different mold heights for sensing temperatures in metal or alloy melts contained in a mold, including a plurality of thermoelements each equipped with a heat resistance coating, by introducing said thermoelements into the melt, determining the position of the interface between liquidus and solidus from the measured temperatures by means of interpolation, controlling the withdrawal speed of the casting such that during the withdrawal of the casting, the interface is always located in a desired area of the stationary insulating member which is slightly above a cooling head 14 when the cooling head is in an upper position, and storing in a data storing unit all data, including at least one of the groups consisting of the withdrawal speed profile over time and data on heating temperature as a function of the distance covered by the mold when the latter exits the heating zone for subsequent casting methods;

casting a molten metal in a subsequent casting process by utilizing the stored data as a process parameter.

2. Method in accordance with claim 1, which includes storing the withdrawal speed profile over time (V=ft) in a computer and making the withdrawal speed profile available for the further casting of parts of like geometry.

3. Device for the manufacture of at least one of the group consisting of directionally solidified and monocrystalline castings in a vacuum furnace having a stationary insulating member comprising: a plurality of sensors introduced into a mold at different heights of the mold for sensing temperatures in metal and alloy melts, a data acquisition unit 55, a process computer 56 for determining the position of the interface between liquidus and solidus from the measured temperatures by means of interpolation, a control unit 57 for controlling the withdrawal of the mold from a heating zone such that during the withdrawal of the casting, the interface is always located in a desired area of the stationary insulating member which is slightly above a cooling head when the cooling head is in an upper position and a data storing unit 58 for storing all data including at least one of the group consisting of the withdrawal speed profile over time and the function of the distance covered by the mold when the latter exits the heating zone.

4. Device in accordance with claim 3, which includes at least one heating temperature control 54 for controlling the heating temperature in the furnace in dependency upon the respective position of the mold in a vacuum furnace 1.

5. Device in accordance with claim 3 which includes a recorder interacting with the computer, for controlling the withdrawal speed of the mold from the heating zone.

* * * * *